(12) United States Patent
Kooiman

(10) Patent No.: US 8,371,877 B2
(45) Date of Patent: Feb. 12, 2013

(54) ELECTRICAL CONNECTOR WITH PRINTED CIRCUIT BOARD SUBASSEMBLY

(75) Inventor: John Kooiman, Mission Viejo, CA (US)

(73) Assignee: Sabritec, Inc., Irvine, CA (US)

( * ) Notice: Subject to any disclaimer, the term of this patent is extended or adjusted under 35 U.S.C. 154(b) by 162 days.

(21) Appl. No.: 12/774,535

(22) Filed: May 5, 2010

(65) Prior Publication Data

US 2011/0275246 A1    Nov. 10, 2011

(51) Int. Cl.
*H01R 13/66* (2006.01)

(52) U.S. Cl. .................................... 439/620.22

(58) Field of Classification Search .......... 439/620.21–620.22, 357, 282, 439/487, 76.1, 676
See application file for complete search history.

(56) References Cited

U.S. PATENT DOCUMENTS

| | | | | |
|---|---|---|---|---|
| 7,434,481 B2 * | 10/2008 | Hawes et al. | ............ | 73/862.391 |
| 7,445,508 B2 * | 11/2008 | Daily et al. | .............. | 439/620.22 |
| 7,824,190 B2 * | 11/2010 | Beck et al. | .................... | 439/76.1 |
| 8,115,568 B2 * | 2/2012 | Hsu | ................................ | 333/33 |
| 2006/0291784 A1 * | 12/2006 | Wang et al. | ...................... | 385/92 |
| 2010/0248547 A1 * | 9/2010 | Sidiki et al. | ............. | 439/620.22 |
| 2012/0164884 A1 * | 6/2012 | Hetzer et al. | ............. | 439/620.22 |

* cited by examiner

*Primary Examiner* — Jean F Duverne
(74) *Attorney, Agent, or Firm* — Finnegan, Henderson, Farabow, Garrett & Dunner, LLP

(57) ABSTRACT

An electrical connector and method of forming the same are provided, where the electrical connector includes a printed circuit board configured to exhibit a first length L, a first width W, a thickness T, and a slot of a slot-width approximately equal to T, the slot also exhibiting a slot-length at least approximately equal to one-half of L. The printed circuit board includes at least a first signal trace, a second signal trace, and a ground plane, where the printed circuit board is configured to electrically isolate the first signal trace and the second signal trace from the ground plane. The first signal trace is configured to make electrical contact with at least a first electrically conductive cable. The electrical connector also includes at least a first contact pin affixed to the printed circuit board and coupled to the second signal trace.

53 Claims, 11 Drawing Sheets

ELECTRICAL CONNECTOR WITH PRINTED CIRCUIT BOARD SUBASSEMBLY

TECHNICAL FIELD

The present disclosure relates generally to an electrical connector, and more particularly, to materials, components, and methods directed to the fabrication and use of an electrical connector with a printed circuit board subassembly.

BACKGROUND

High speed digital signals are used extensively for transmitting and receiving various types of data, for example, for defense and commercial applications. Data rates or speeds for high speed digital signals are typically measured in gigabits per second (GBPS). Often, the commercial or strategic value of transmitted information is a function of the speed at which it is delivered. Consequently, it is desirable to increase the data rate of such digital signals. As described further below, however, where the high speed digital signals are transmitted over copper or other electrically conductive cabling, the distance along which such signals may be reliably transmitted will shorten as the data rate increases.

Digital signals are electrical pulses as a function of time that rapidly change between two voltage levels that are commonly known as logic levels "0" and "1." To have properly formed pulses as a function of time, the underlying voltage level must change between "0" and "1" rapidly, resulting in a time-dependent waveform that approximates a square wave with sharp edges. The sharp edges associated with a time-dependent pulse are commonly known as the rise and fall times (or edge rates) of the pulse. When convoluted in the time domain according to Fourier transform analysis, a square wave with sharp edges can be shown to be a sum of sinusoidal waveforms at a fundamental frequency and also higher-order odd harmonics of the fundamental frequency (e.g., the $3^{rd}$ and $5^{th}$ harmonic frequencies). To maintain the sharp edges of the square wave waveform, these contributions from the higher order odd harmonic frequencies must bear a specific relationship to the fundamental frequency. That is, the relative amplitude and phase of the different frequency contributions must be in a well-defined relationship in order to sum to create a square wave with a sharp edge.

As described above, high speed digital signals may be transmitted using copper cable or other electrically conductive cable connected to a pin contact. For example, FIG. 1 shows Twinax pin contact 100, which is a conventional electrical connector used to connect Twinax cabling. Twinax cabling, in turn, utilizes copper or other electrically conductive material as the medium that carries time-dependent voltage pulses from a signal source (not shown), and which pulses may be detected and resolved at a given location from the signal source as high speed digital signals. Pin contact 100 includes insulator 110 at a front end, cable socket 120 at a rear end for connecting to the cable, and outer body 130 that extends between the two ends. Pin contact 100 also includes two contact pins 160 that are positioned in two respective openings in insulator 110. Related conventional cabling and pin contacts that also use electric conductive cabling material, such as copper, include Quadrax cabling (not shown) and Quadrax pin contacts (not shown).

Conventional copper cable, or other electrically conductive cable, will exhibit a phenomenon called "frequency dependant cable loss." As applied to time-dependent signals, such electrical loss refers to the attenuation of a time-dependent signal at a given frequency that is more pronounced at higher frequencies over a given length of cabling. This phenomenon is related to the so-called "skin effect," where the current density of a current flowing within a conductor (such as copper) is greater near the surface of a cylindrical conductor than near the core of such a cylinder. Thus, the "skin effect" tends to restrict the ability of high frequency electrical currents to utilize the full cross section of a cylindrical cable, thereby resulting in a higher electrical resistance and, hence, higher electrical losses at higher frequencies.

Accordingly, a cable exhibiting "frequency dependant cable loss" will attenuate signals transmitted at the $3^{rd}$ and $5^{th}$ harmonics of a fundamental frequency at a given length, more so than the fundamental frequency itself (and the $5^{th}$ harmonic more than the $3^{rd}$, etc.) and will thereby end up distorting the proper proportion of frequencies between the fundamental and higher order harmonics. As a function of the length over which it is transmitted, this nonlinear attenuation will cause the shape of the voltage pulse to become distorted and, specifically, to lose its sharp edges over that length. At a sufficiently large length of cable (and with a given initial distribution of pulses), such distortion increases to the point where a receiver is no longer able to accurately resolve the original set and distribution of pulses, and thereby decode the originally transmitted signal.

Accordingly, although a conventional Twinax cable and Twinax pin contact 100 may be able to carry voltage pulses associated with high speed digital signals, conventional Twinax cabling and Twinax pin contact 100 will tend to produce higher electrical losses at higher frequencies, and thus distort these underlying voltage pulses so that—over a sufficiently great length—any originally encoded signal is no longer able to be resolved.

Consequently, there is a need to provide an electrical connector that is capable of counterbalancing the inherent distortion that high speed digital signals exhibit over sufficiently great length of electrical conductive cabling, such as copper.

SUMMARY

In one embodiment consistent with the present disclosure, one or more of the problems set forth above may be overcome by the manufacture and use of an in-line equalizer.

In one aspect, the present disclosure is directed to an electrical connector including a printed circuit board configured to exhibit a first length L, a first width W, and a thickness T, where the printed circuit board is configured to exhibit a printed circuit board slot of a slot-width approximately equal to the thickness T, and the printed circuit board slot also exhibits a slot-length at least approximately equal to one-half of the first length L. The printed circuit board includes at least a first signal trace, a second signal trace, and a ground plane, where the printed circuit board is configured to electrically isolate the first signal trace and the second signal trace from the ground plane. The first signal trace is configured to make electrical contact with at least a first electrically conductive cable. The electrical connector also includes at least a first contact pin affixed to the printed circuit board and configured to make electrical contact with the second signal trace.

In another aspect, the present disclosure is directed to an electrical connector including a printed circuit board configured to exhibit a first width W. The printed circuit board includes at least a first signal trace, a second signal trace, and a ground plane, where the printed circuit board is configured to electrically isolate the first signal trace and the second signal trace from the ground plane. The first signal trace is configured to make electrical contact with at least a first electrically conductive cable. The electrical connector also includes at least a first contact pin affixed to the printed circuit board and configured to make electrical contact with the second signal trace. The first electrically conductive cable is further electrically isolated from and disposed within electrically conductive shielding such that the electrically conductive shielding forms a contiguous cylinder of approximate diameter D, where the first width W is less than approximately twice the diameter D.

In a further aspect, the present disclosure is directed to an electrical connector including a first printed circuit board including a first printed circuit board slot and a second printed circuit board at least partially disposed within the first printed circuit board. The first printed circuit board includes at least a first signal trace, a second signal trace, and a first ground plane. The first printed circuit board is further configured to electrically isolate the first signal trace and the second signal trace from the first ground plane. The second printed circuit board includes at least a third signal trace, a fourth signal trace, and a second ground plane. The second printed circuit board is configured to electrically isolate the third signal trace and the fourth signal trace from the second ground plane. The electrical connector also includes at least a first contact pin affixed to the first printed circuit board and configured to make electrical contact with the second signal trace, a second contact pin affixed to the second printed circuit board and configured to make electrical contact with the fourth signal trace, and at least one processor affixed to one of the set of: the first printed circuit board and the second printed circuit board.

In an additional aspect, the present disclosure is directed to a method of forming an electrical connector. The method includes affixing a processor to a printed circuit board, attaching a contact pin to the printed circuit board, and disposing at least a portion of the the processor, the contact pin, and the printed circuit board into an outer body. The printed circuit board includes at least a first signal trace, a second signal trace, and a ground plane. The printed circuit board is configured to electrically isolate the first signal trace and the second signal trace from the ground plane. The processor is electrically connected to the first signal trace and the second signal trace. The printed circuit board is further configured to exhibit a first length L, a thickness T, and a printed circuit board slot of a slot-width approximately equal to the thickness T, the printed circuit board slot also exhibits a slot-length at least approximately equal to one-half of the first length L.

In yet another aspect, the present disclosure is directed to a method of forming an electrical connector. The method includes affixing a processor to a printed circuit board, attaching a contact pin to the printed circuit board, and disposing at least a portion of the processor, the contact pin, and the printed circuit board into an outer body of approximate diameter D. The method also includes affixing the outer body to a communications cable. The printed circuit board includes at least a first signal trace, a second signal trace, and a ground plane. The printed circuit board is configured to electrically isolate the first signal trace and the second signal trace from the ground plane. The processor is electrically connected to the first signal trace and the second signal trace. The communications cable includes an electrically conductive cable disposed within electrically conductive shielding such that the electrically conductive shielding forms a contiguous cylinder of approximate diameter D2, and the diameter D is less than approximately twice the diameter D2.

Additional features and advantages will be set forth in part in the description which follows, being apparent from the description of or learned by practice of the disclosed embodiments. The features and advantages will be realized and attained by means of the elements and combinations particularly pointed out in the appended claims.

It is to be understood that both the foregoing general description and the following detailed description are exemplary and explanatory only and are not restrictive of the scope of the embodiments, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DETAILED DESCRIPTION

Figure 1:
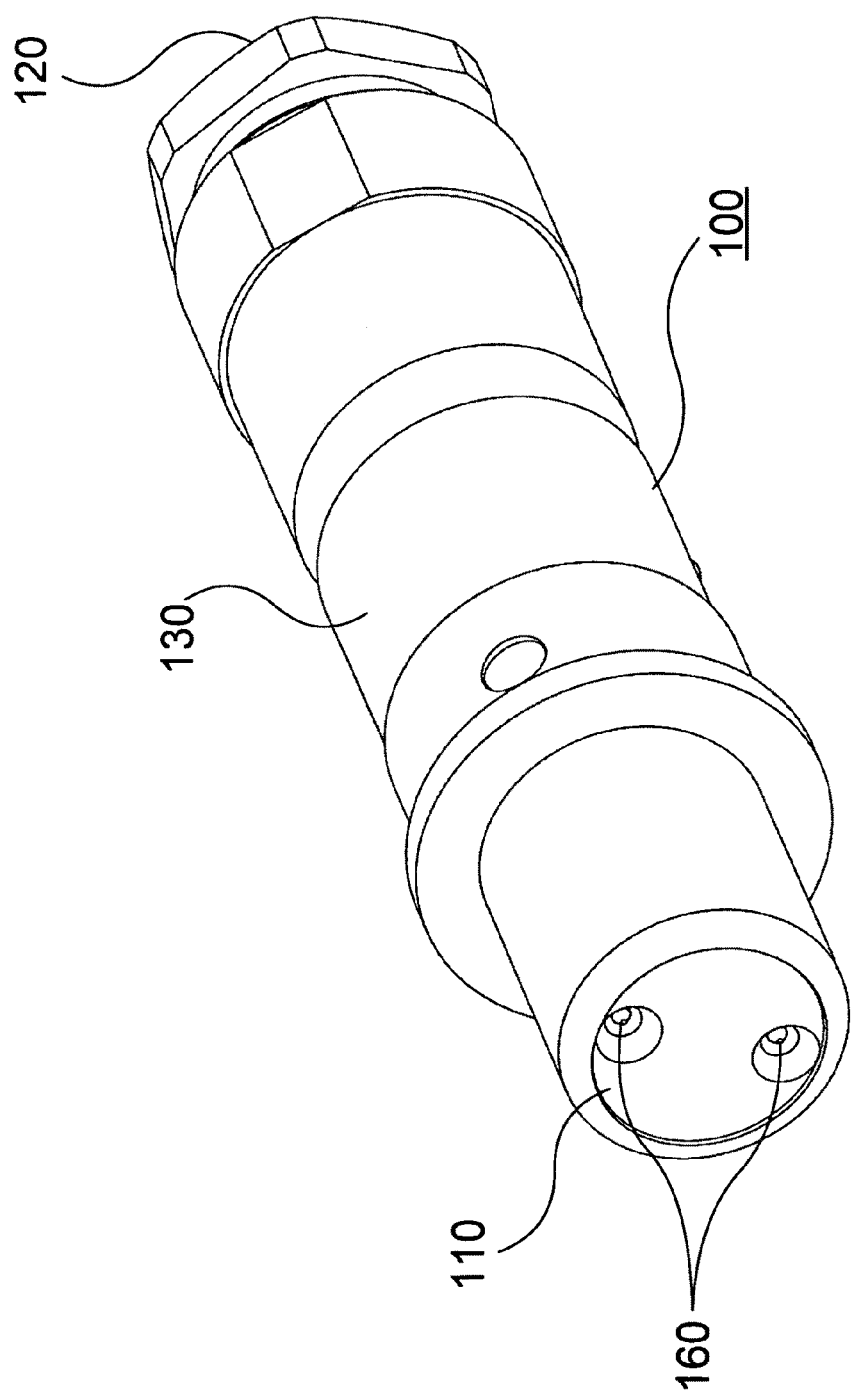
FIG. 1 is a perspective view of a conventional Twinax pin contact.

Reference will now be made in detail to exemplary embodiments of the invention, examples of which are illustrated in the accompanying drawings. Wherever possible, the same reference numbers will be used throughout the drawings to refer to the same or like parts.

FIGS. 2-11 show the components and subassemblies included in various electrical connectors, such as Twinax pin contacts or Quadrax pin contacts, according to various exemplary embodiments. The electrical connectors are configured to transmit high speed digital signals between electrically conductive cable (e.g., copper cable), signal sources, signal receivers, or other devices.

The terms "front" and "rear" are used herein to refer to the ends of an exemplary electrical connector or components of the electrical connector. "Front" refers to an end of the electrical connector or component that is proximal to or includes a contact pin of the electrical connector. In contrast, "rear" refers to an end of the electrical connector or component opposite the front end, such as an end of the electrical connector or component that is proximal to or includes a socket of the electrical connector and/or an end of the electrical connector configured to connect to the conductive cable.

The terms "Twinax" and "Quadrax" refer to a configuration of the components of an exemplary electrical connector. Specifically, "Twinax" refers to an electrical connector associated with Twinax cabling, which refers to a pair of conductive wires, embedded in an insulator, and enclosed with a conductive shield that is generally cylindrical. The conductive wires can be connected to the electrical connector in a shielded and impedance controlled configuration. Similarly, "Quadrax" refers to an electrical connector that is configured to connect to two pairs of conductive wires, embedded in an insulator and enclosed within a conductive shield that is generally cylindrical. The pairs of conductive wires can be connected to the electrical connector in a shielded and impedance controlled configuration. Each pair of conductive wires in the Quadrax configuration can be oriented at 90 degrees or other angle with respect to each other so that electrical coupling between the pairs of wires is minimized.

The electrical connectors disclosed herein may be used in a variety of applications, such as, but not limited to, aerospace, defense, or commercial (e.g., commercial aviation) applications. For example, the electrical connectors may be sized and dimensioned to correspond to any one or more of standards MIL-DTL-38999 (formerly MIL-C-38999) and/or SAE-AS39029 (formerly MIL-C-39029).

FIGS. 2-6 and 8 show the components and subassemblies that can be included in various Twinax pin contacts, according to an exemplary embodiment. The Twinax pin contact can include insulator 110, cable socket 120, and outer body 130 described above in connection with Twinax pin contact 100 of FIG. 1. In an exemplary embodiment, the Twinax pin contact can include Twinax subassembly 200 inserted in outer body 130 between insulator 110 and cable socket 120.

Figure 2:
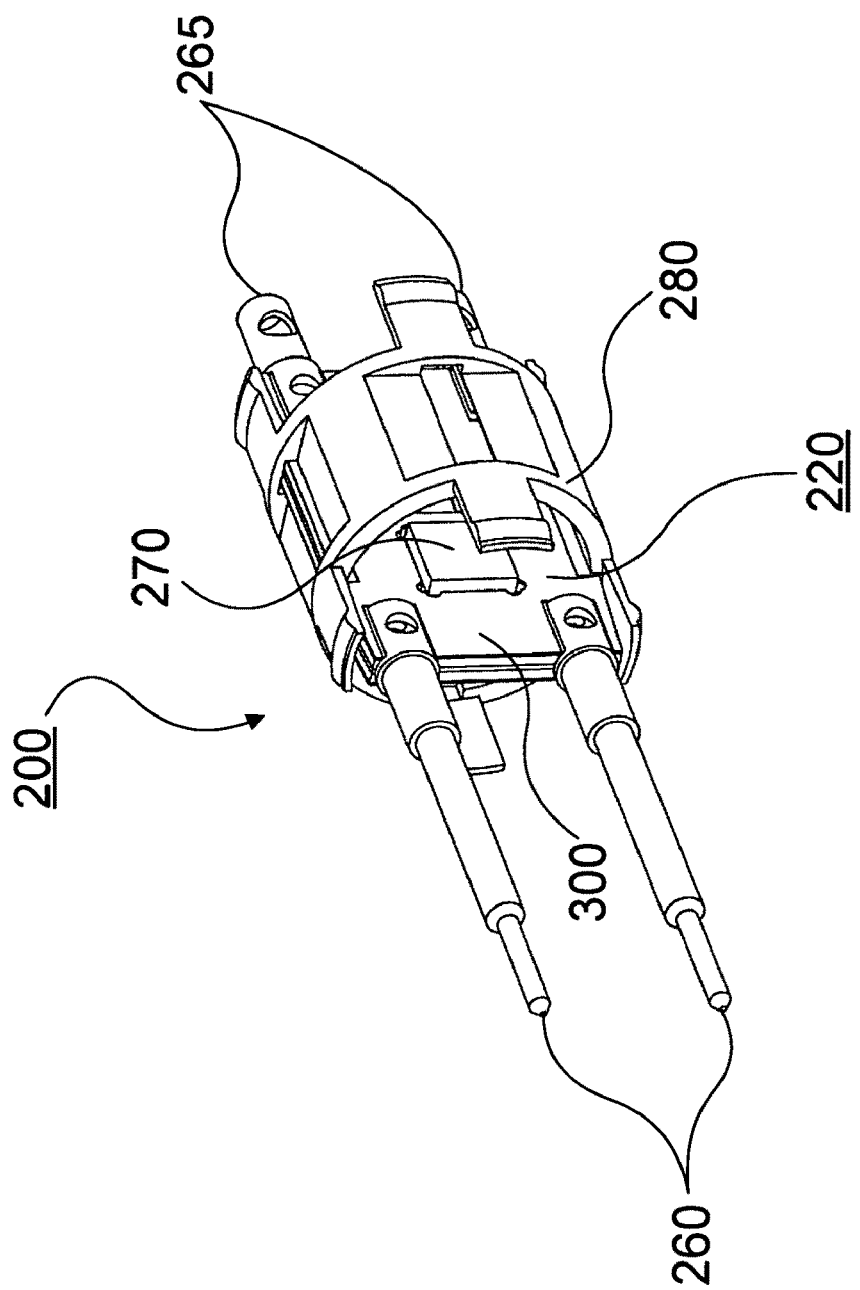
FIG. 2 is a perspective view of a Twinax subassembly, according to an exemplary embodiment.

FIG. 2 shows an exemplary embodiment of Twinax subassembly 200. Twinax subassembly 200 can include printed circuit board (PCB) and chip assembly 220 and ground clip 280, which will be described in more detail below. PCB and chip assembly 220 can include one or more contact pins 260, one or more sockets or wire termination solder cups 265, equalizer chip 270, and PCB 300. PCB and chip assembly 220 can be inserted into ground clip 280. Contact pins 260, wire termination solder cups 265, and equalizer chip 270 can be connected to PCB 300, as will be described in more detail below.

Figure 3:
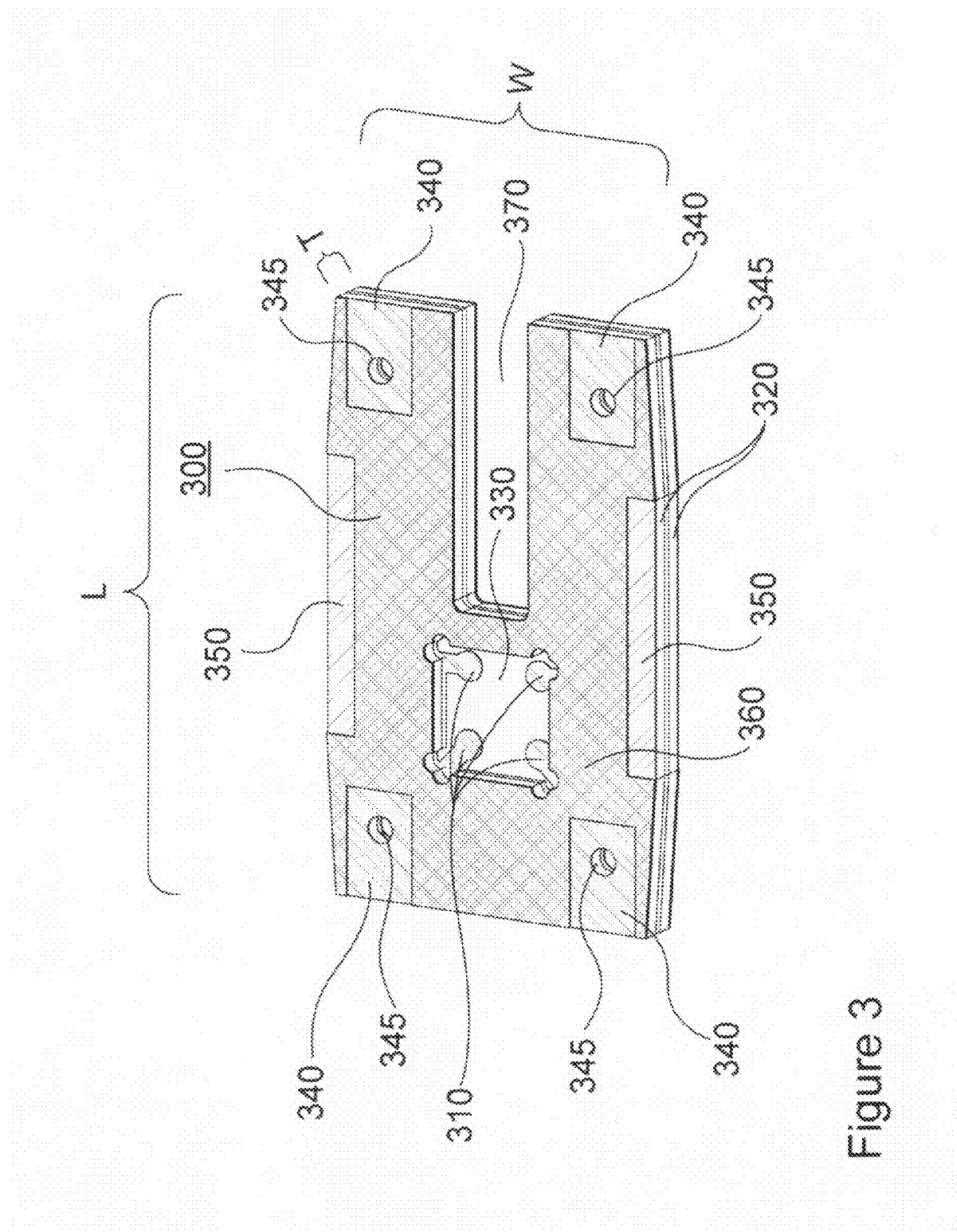
FIG. 3 is a perspective view of a printed circuit board, according to an exemplary embodiment.

FIG. 3 shows an exemplary embodiment of PCB 300. PCB 300 is a multi-layer board including a plurality of signal traces 310 included in a middle layer and two ground planes 320 that are outer layers. Thus, PCB 300 can include at least these three electrically conductive layers. It is understood, however, that PCB 300 can include fewer than these three electrically conductive layers or more than these three electrically conductive layers. For example, PCB 300 can include only one of two ground planes 320. Providing two ground planes 320 can provide increased protection against crosstalk between signal traces 310.

Signal traces 310 are conductor paths, e.g., formed by printing or etching, that extend along the middle layer to transmit or route signals, e.g., to and from equalizer chip 270. Each signal trace 310 can be electrically connected at one end to equalizer chip 270 (FIGS. 2, 4-6, and 11), e.g., using a solder reflow process. The width of signal traces 310 can be controlled, e.g., to produce a 50 ohm nominal impedance structure known as a "strip line" transmission line. Signal traces 310 and middle layer can be sandwiched between ground planes 320. The embodiment shown in FIG. 3 includes four signal traces 310.

As shown in FIG. 3, PCB 300 can include an alignment cavity 330 extending through either one of the ground planes 320. Alignment cavity 330 exposes one end of each signal trace 310 for connecting to equalizer chip 270. As shown in FIG. 3, each of four signal traces 310 can extend to a different portion of alignment cavity 330, such as the respective corners. Alignment cavity 330 can serve as a self-fixturing or alignment structure that holds equalizer chip 270 in a proper position during the solder reflow process for connecting equalizer chip 270 to signal traces 310. Alternatively, alignment cavity 330 can be omitted, and equalizer chip 270 can be mounted to an outer surface of PCB 300, e.g., an outer surface of one of the ground planes 320. In such an embodiment, one or more electrical connections can extend through ground plane 320 to electrically connect equalizer chip 270 to signal traces 310.

Signal traces 310 can be connected to corresponding signal pads 340 on one or both of ground planes 320 of PCB 300 by corresponding via holes 345. Signal pads 340 are electrically isolated from ground planes 320, e.g., by an insulating layer (not shown). As shown in FIG. 3, each of four signal traces 310 can extend from alignment cavity 330 to the respective signal pads 340, e.g., located near corners of PCB 300. In the exemplary embodiment, the two signal traces 310 that are closer to one end of PCB 300 can connect to the two respective signal pads 340 located near the same end of PCB 300, and the two signal traces 310 closer to the other end of PCB 300 can connect to the two respective signal pads 340 located near that same end of PCB 300. Alternatively, PCB 300 can include more or less than four total signal pads 340 and corresponding signal traces 310 so that there can be one or more signal pads 340 located near one end of PCB 300, and one or more signal pads 340 located near the other end of PCB 300. For example, PCB 300 can include a single signal trace 310 connecting equalizer chip 270 to one signal pad 340 near one end of PCB 300 and a single signal trace 310 connecting equalizer chip 270 to one signal pad 340 near the other end of PCB 300. As another alternative, signal pads 340 can be provided near the respective ends of PCB 300 and not necessarily at the respective ends of PCB 300.

Two ground planes 320 can extend along nearly all of PCB 300 except for the region defined by alignment cavity 330. Ground planes 320 can include ground plane contacts 350, and ground plane contacts 350 can be connected, for example, by soldering, to ground clip 280 (FIGS. 2, 8, 9, and 11). As shown in FIG. 3, ground plane contacts 350 can be provided along both side edges of PCB 300. Alternatively, ground plane contacts 350 can be provided at other locations of PCB 300 or only along a single side edge of PCB 300.

Two ground planes 320 can be covered with an electrically nonconductive solder mask layer 360, except where soldering is used, e.g., ground plane contacts 350, via holes 345, etc. In the alternative embodiments in which alignment cavity 330 is omitted, equalizer chip 270 can be mounted on solder mask layer 360. Furthermore, insulating layers (not shown) can be provided to electrically isolate ground planes 320 from signal traces 310 and signal pads 340.

Figure 4:
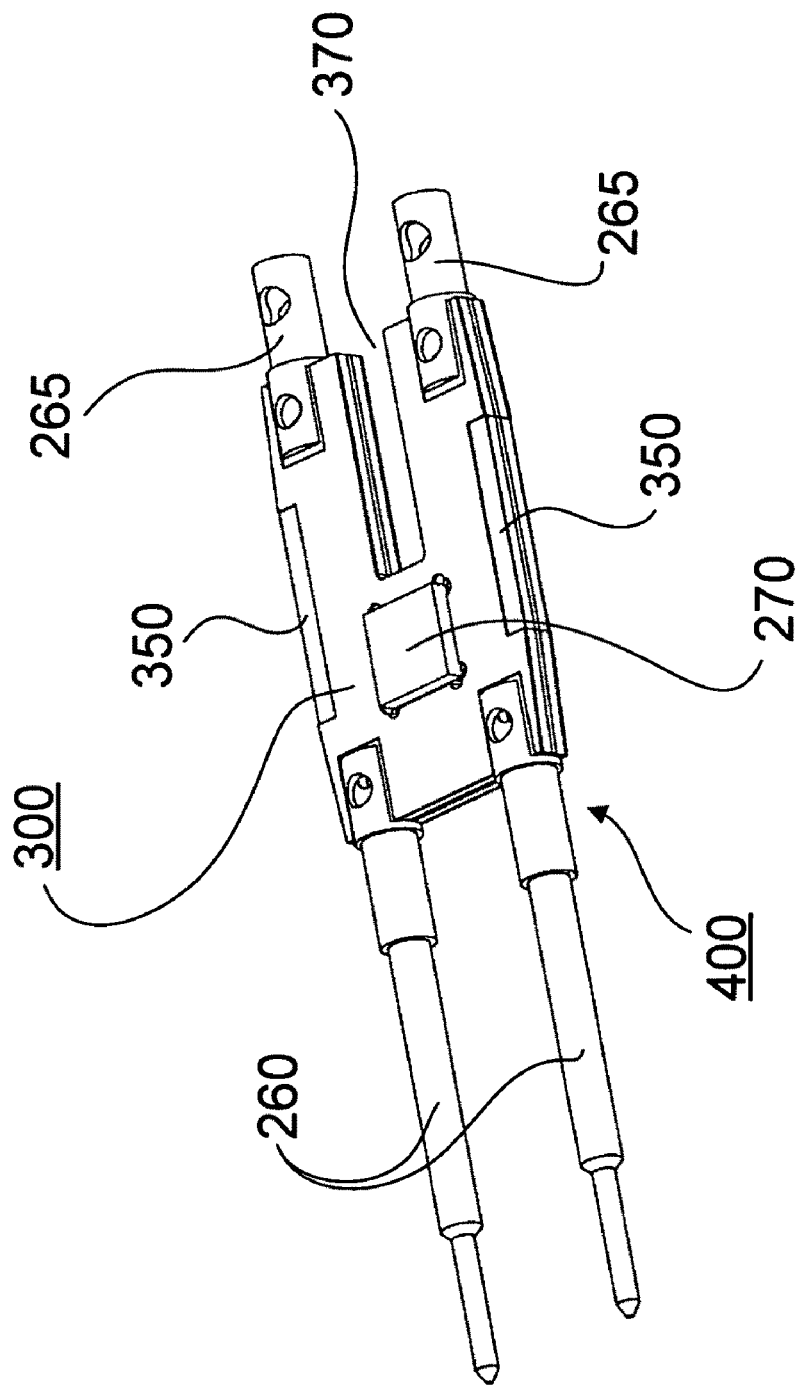
FIG. 4 is a perspective view of a rear-slot printed circuit board and chip assembly, according to an exemplary embodiment.

PCB 300 can also include PCB slot 370 that can extend from either end of PCB 300. According to the embodiment shown in FIGS. 2, 4, and 6, PCB slot 370 extends from a rear end of PCB 300, i.e., the end of PCB 300 opposite the end to be connected to contact pins 260 as described below. Accordingly, the embodiment of PCB 300 shown in FIGS. 2, 4, and 6 is described herein as a "rear-slot PCB." In other embodiments, such as the embodiment shown in FIG. 5, PCB slot 370 extends from a front end of PCB 300, i.e., the end of PCB 300 to be connected to contact pins 260 as described below. Accordingly, the embodiment of PCB 300 shown in FIG. 5 is described herein as a "front-slot PCB." As an alternative, such as in some Twinax pin contacts, PCB 300 does not include PCB slot 370.

PCB and chip assembly 220 shown in FIG. 2 can include a rear-slot PCB, a front-slot PCB, or a PCB without a slot.

FIGS. 4 and 6 show a rear-slot PCB and chip assembly 400, which includes PCB 300 configured with a rear PCB slot. FIG. 5 shows a front-slot PCB and chip assembly 500, which includes PCB 300 configured with a front PCB slot. The Twinax pin contact can include either the rear-slot PCB and chip assembly 400, front-slot PCB and chip assembly 500, or a PCB and chip assembly with a PCB without a slot. The Quadrax pin contact can include both the rear-slot PCB and chip assembly 400 and front-slot PCB and chip assembly 500, as will be described below.

Figure 5:
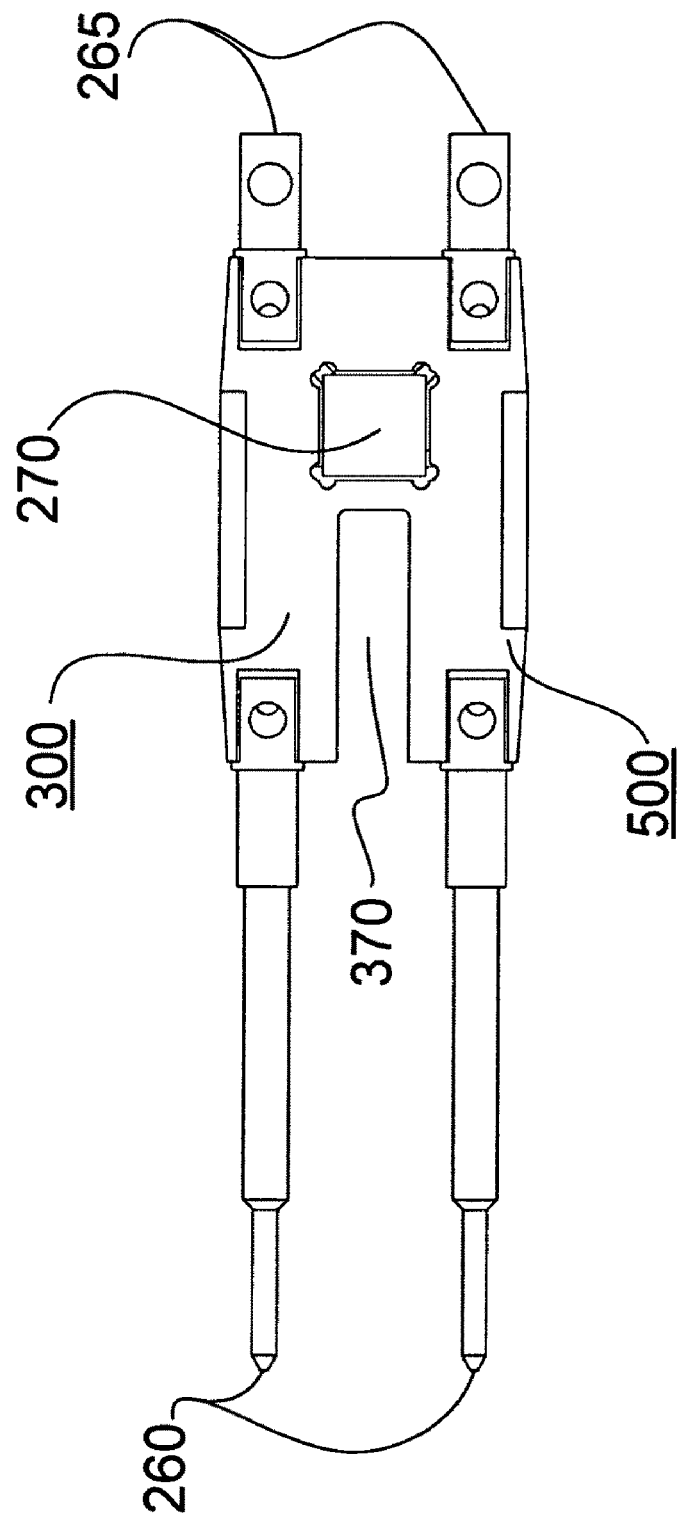
FIG. 5 is a top view of a front-slot printed circuit board and chip assembly, according to an exemplary embodiment.
Figure 6:
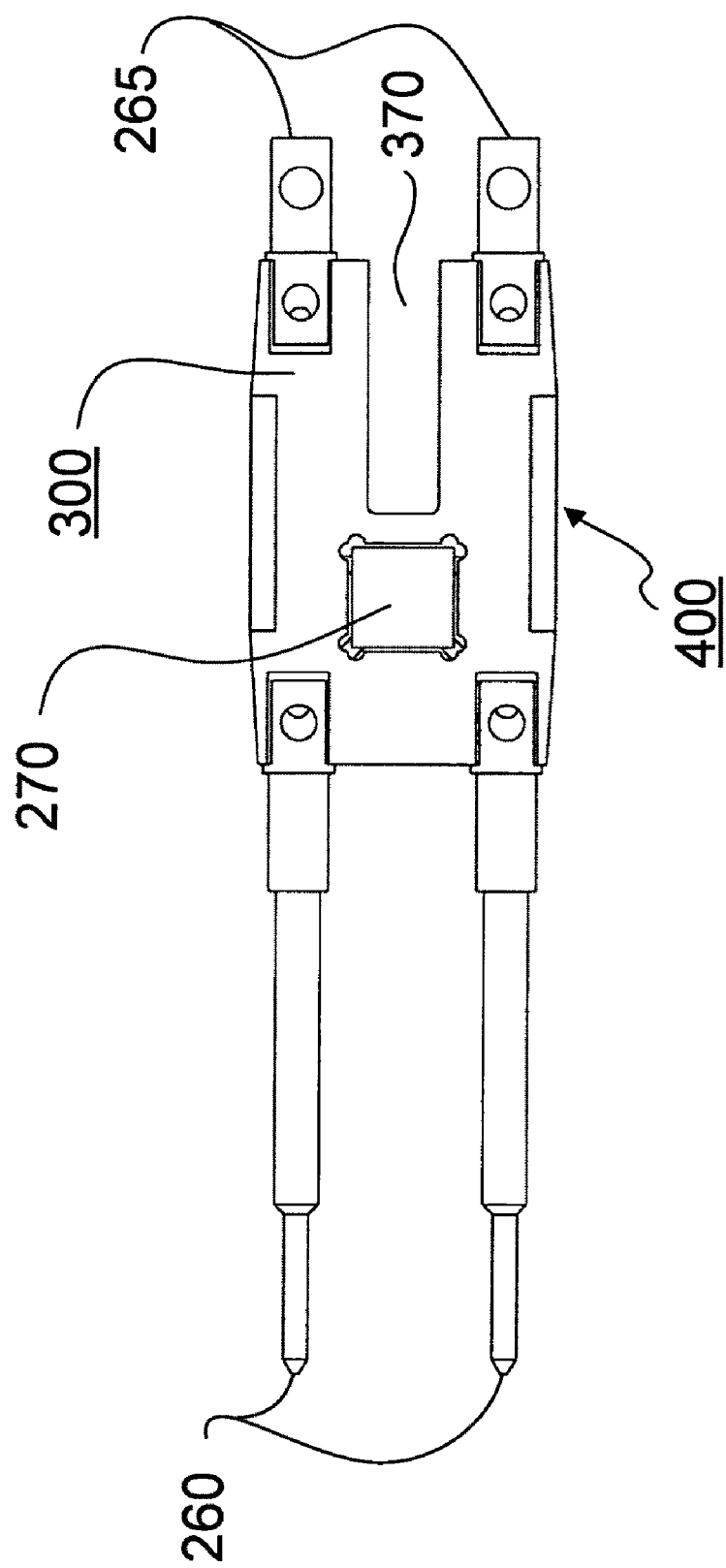
FIG. 6 is a top view of the rear-slot printed circuit board and chip assembly of FIG. 4.

To form the front- and rear-slot PCB and chip assemblies 400, 500 shown in FIGS. 4-6, equalizer chip 270 can be affixed to signal traces 310 of PCB 300, as described above. Contact pins 260 can be affixed to signal pads 340 at the one end of PCB 300, e.g., using high temperature solder. Wire termination solder cups 265 can be affixed to signal pads 340 at the opposite end of PCB 300, e.g., using high temperature solder. Then, either the front- or rear-slot PCB and chip assembly 400, 500 can be inserted into ground clip 280 (FIGS. 2, 8, 9, and 11) to form Twinax subassembly 200 shown in FIG. 2. Ground plane contacts 350 of the PCB 300 can be affixed to ground clip 280, e.g., using solder.

Next, a pair of wires of a Twinax cable (not shown) can be electrically connected to the respective wire termination solder cups 265 of Twinax subassembly 200, e.g., by soldering. Contact pins 260 of Twinax subassembly 200 can be inserted into respective passages in insulator 110 (FIG. 1). Twinax subassembly 200 and insulator 110 can be inserted into outer body 130 (FIG. 1). A clamp nut (not shown) that is slidably disposed around the Twinax cable can be secured to the rear end of the Twinax pin contact to secure Twinax subassembly 200 and insulator 110 inside outer body 130. Similar steps for inserting and securing front- and rear-slot PCB and chip assembly 400, 500 in a Quadrax configuration into an outer body will be described in more detail below in connection with the assembly of the Quadrax pin contact.

FIGS. 7-11 show the components and subassemblies of a Quadrax pin contact 1000, according to an exemplary embodiment. Quadrax pin contact 1000 (FIGS. 10 and 11) can include a Quadrax subassembly 900 (FIG. 9), and Quadrax subassembly 900 can include both rear-slot PCB and chip assembly 400 shown in FIGS. 4 and 6 and front-slot PCB and chip assembly 500 shown in FIG. 5.

Figure 7:
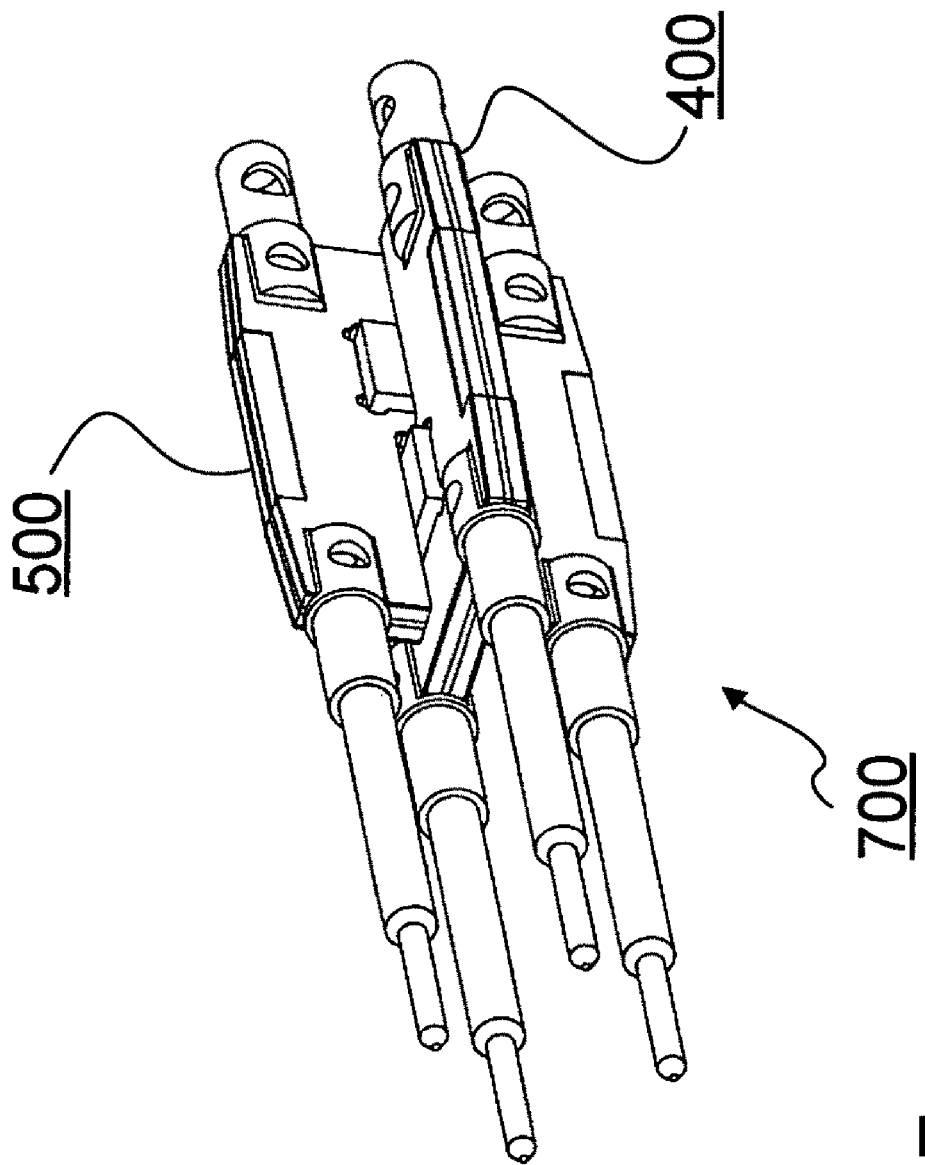
FIG. 7 is a perspective view of the front-slot printed circuit board and chip assembly of FIG. 5 and the rear-slot printed circuit board and chip assembly of FIGS. 4 and 6 in a Quadrax configuration.

FIG. 7 shows rear-slot PCB and chip assembly 400 and front-slot PCB and chip assembly 500 arranged in a Quadrax configuration 700. Quadrax subassembly 900 (FIG. 9) is constructed by interleaving rear-slot PCB and chip assembly 400 and front-slot PCB and chip assembly 500. For example, as shown in FIG. 7, PCB 300 of rear-slot PCB and chip assembly 400 can be inserted along the lengthwise (longitudinal) direction into PCB slot 370 of front-slot PCB and chip assembly 500, while PCB 300 of front-slot PCB and chip assembly 500 is inserted along the lengthwise (longitudinal) direction into PCB slot 370 of rear-slot PCB and chip assembly 400. In this position, contact pins 260 of the two PCB and chip assemblies 400, 500 are generally parallel and extend from the respective PCBs in generally the same direction, and wire termination solder cups 265 of the two PCB and chip assemblies 400, 500 are also generally parallel and extend from the respective PCBs in generally the same direction. PCB and chip assemblies 400, 500 can be positioned approximately orthogonally (at approximately 90 degrees) from each other. Alternatively, and depending upon the dimensions of the interleaved slots, and the relative angles separating spring fingers 880 of ground clip 280, PCB and chip assemblies 400, 500 can be positioned at other angles with respect to each other.

In a preferred embodiment, each PCB slot 370 extends approximately at least half the length of its respective PCB 300 and is wide enough to accommodate the thickness of another PCB 300 (including the corresponding equalizer chip 270 attached to the other PCB 300). As a result, both PCB and chip assembly 400 and PCB and chip assembly 500 can be included in Quadrax pin contact 1000, having an approximate length of only one PCB and chip assembly.

Figure 8:
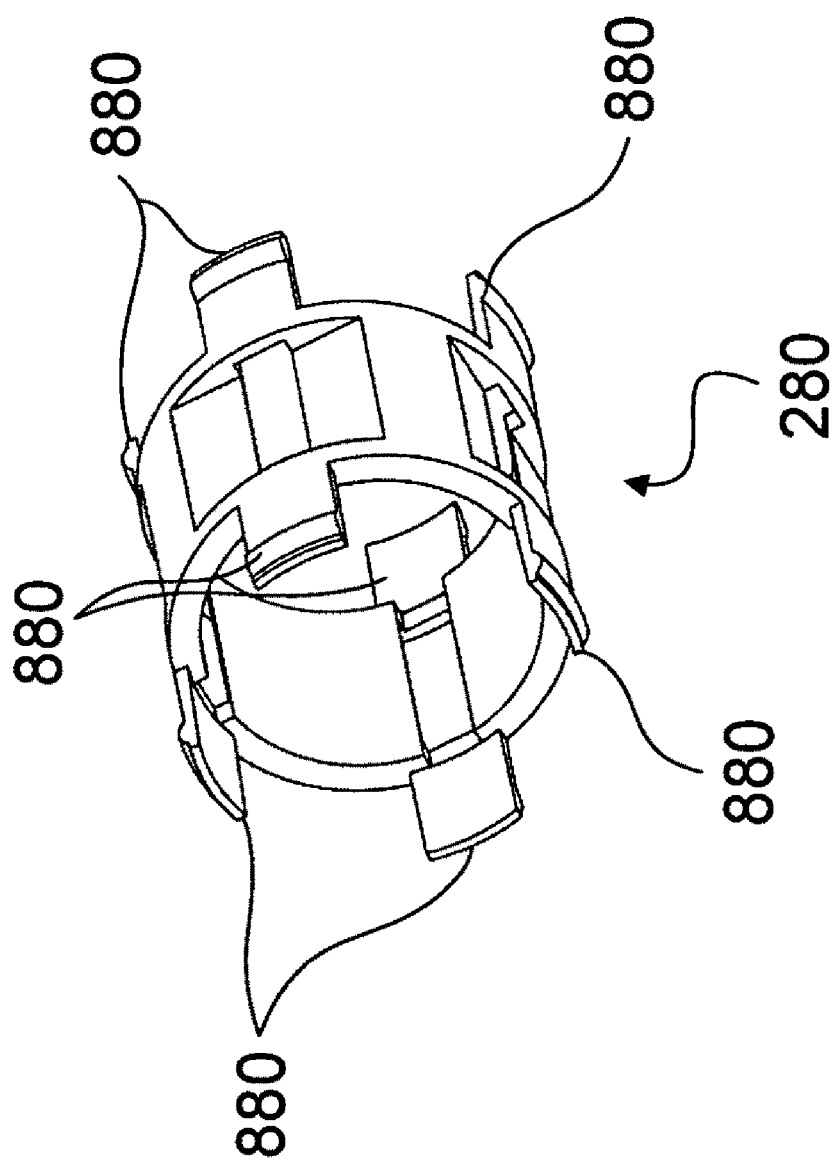
FIG. 8 is a perspective view of a ground clip, according to an exemplary embodiment.
Figure 9:
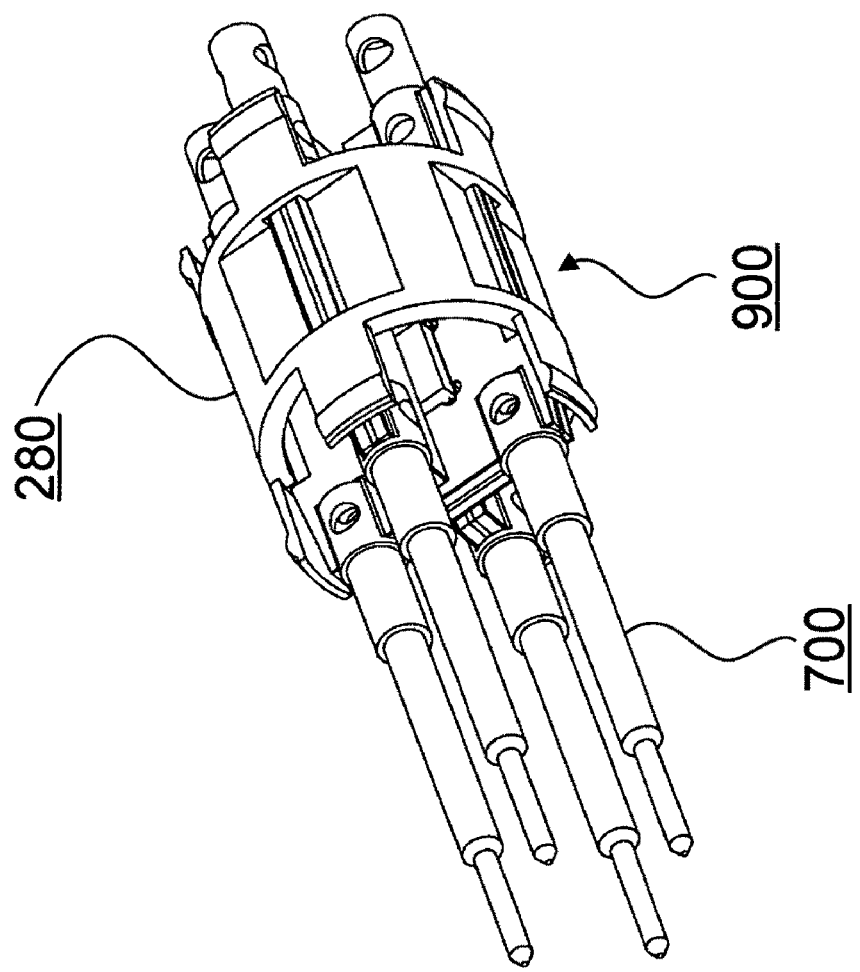
FIG. 9 is a perspective view of a Quadrax subassembly, according to an exemplary embodiment.

FIG. 8 shows an exemplary embodiment of ground clip 280. The interleaved PCB and chip assemblies 400, 500 arranged in Quadrax configuration 700, as shown in FIG. 7, can be inserted into ground clip 280 to form Quadrax subassembly 900. FIG. 9 shows an exemplary embodiment of Quadrax subassembly 900 including the interleaved PCB and chip assemblies 400, 500 arranged in Quadrax configuration 700 and disposed in ground clip 280.

Ground clip 280 can be formed from an electrically conductive material. Ground clip 280 can include a plurality of spring fingers 880 or other biased members. Spring fingers 880 can be made of a suitable spring material, such as beryllium copper. Ground plane contacts 350 of PCBs 300 of both the rear-slot and front-slot PCB and chip assemblies 400, 500 of Quadrax subassembly 900 can be electrically connected to ground clip 280, for example, using solder.

Figure 10:
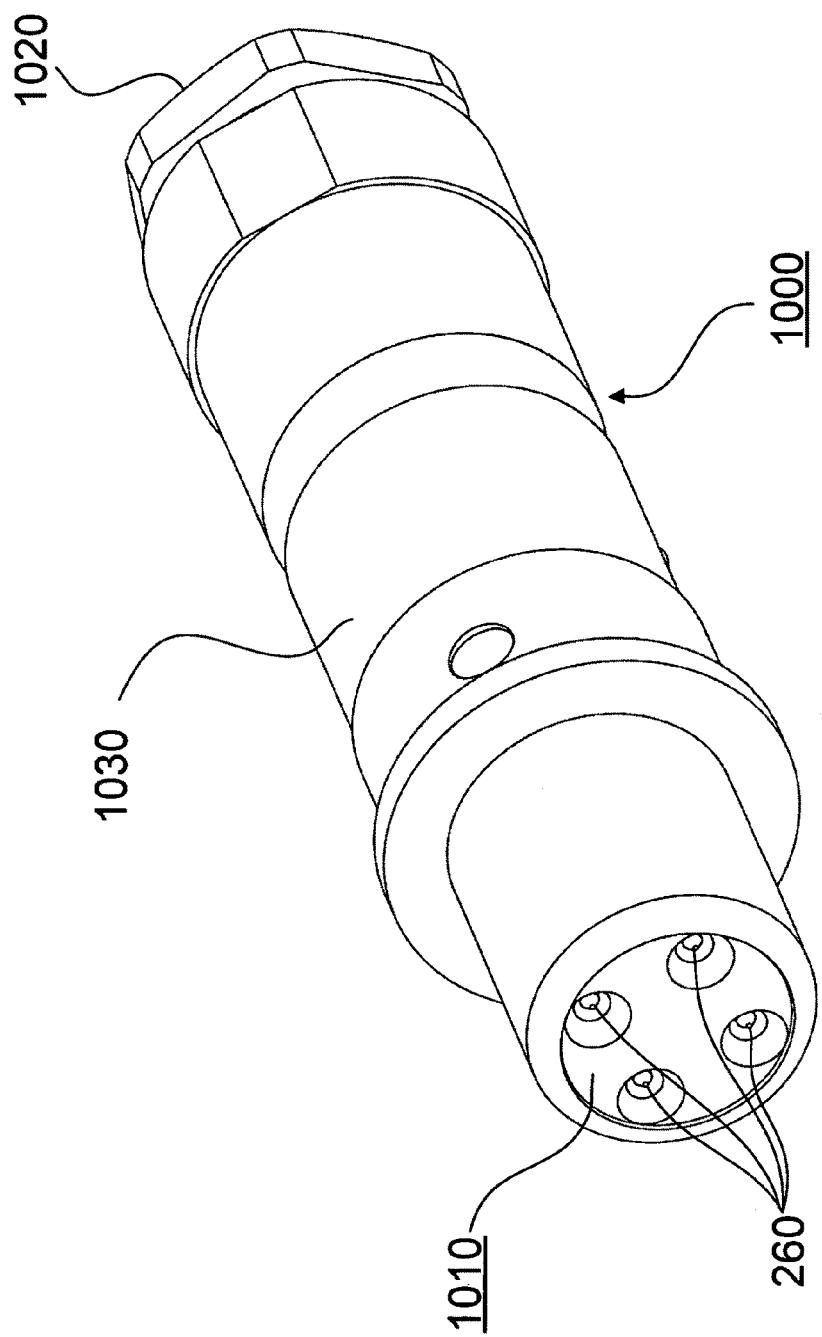
FIG. 10 is a perspective view of a Quadrax pin contact, according to an exemplary embodiment.
Figure 11:
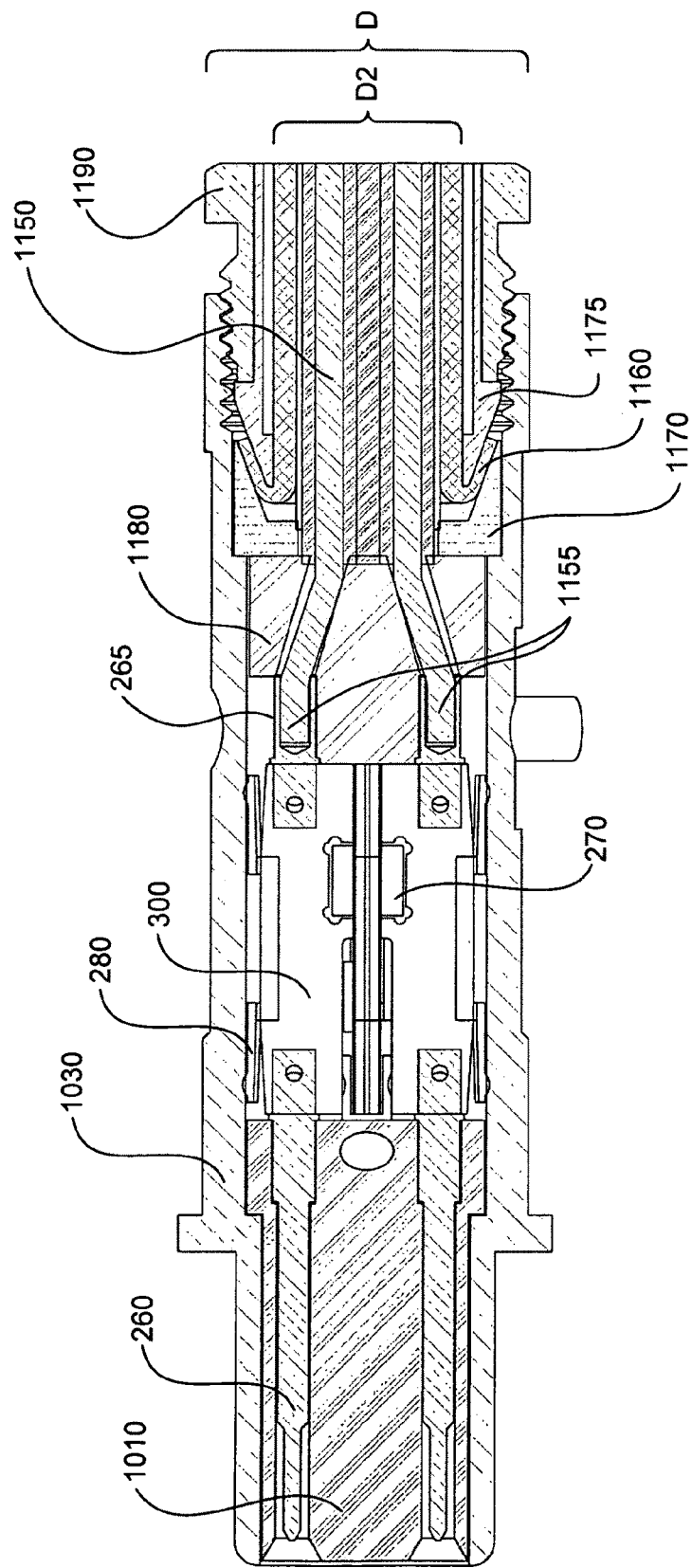
FIG. 11 is a cross-sectional view of the Quadrax pin contact of FIG. 10 connected to a Quadrax cable.

FIG. 10 shows assembled Quadrax pin contact 1000, and FIG. 11 shows a cross-sectional view of assembled Quadrax pin contact 1000 with Quadrax cable 1150 connected to the rear end of Quadrax pin contact 1000. Quadrax pin contact 1000 can include front insulator 1010 at the front end, cable socket 1020 at the rear end, and a generally cylindrical outer body 1030 that extends between the front and rear ends. Quadrax cable 1150 can connect to cable socket 1020. Quadrax cable 1150 includes at least two pairs of electrically conductive wires 1155 and cable shield 1160 surrounding wires 1155. Cable shield 1160 can form a contiguous cylinder, as shown in FIG. 11.

Quadrax cable 1150 is prepared before being connected to Quadrax subassembly 900. For example, the end of cable shield 1160 to be connected to Quadrax subassembly 900 can be separated from wires 1155 and flipped inside out, as shown in FIG. 11, so that the end of cable shield 1160 folds over and extends back toward the bulk of Quadrax cable 1150 and away from exposed wires 1155 of Quadrax cable 1150.

Front bushing 1170, rear bushing 1175, rear insulator 1180, and/or clamp nut 1190 can be disposed on the end of Quadrax cable 1150. For example, the folded-over end of cable shield 1160 can be inserted between front bushing 1170 and rear bushing 1175, as shown in FIG. 11. Front bushing 1170 can be cylindrical and can include a front face including a central opening through which wires 1155 of Quadrax cable 1150 can extend. Front bushing 1170 can include an inner surface against which the folded-over portion of cable shield 1160 can abut. The inner surface of front bushing 1170 can be angled such that the diameter of the inner surface tapers towards the front end of front bushing 1170.

Rear bushing 1175 can also be cylindrical, and Quadrax cable 1150 can be inserted through rear bushing 1175. A front edge of rear bushing 1175 can be inserted into the fold in cable shield 1160 so that cable shield 1160 is folded over the front edge of rear bushing 1175, and the end of cable shield 1160 can extend between front bushing 1170 and rear bushing 1175. The front end of rear bushing 1175 can include a tapered surface that increases in diameter toward a rear end of rear bushing 1175 so that the tapered surface is complementary to the angled inner surface of front bushing 1170 and so that the tapered surface of rear bushing 1175 increases to form a flange that extends outward from the outer surface of rear bushing 1175.

Clamp nut 1190 can be slidably disposed around Quadrax cable 1150 and rear bushing 1175. A front end of clamp nut 1190 can abut a rear surface of the flange of rear bushing 1175. An outer surface of the front end of clamp nut 1190 can be threaded.

After preparing Quadrax cable 1150 as described above, Quadrax cable 1150 can be connected to Quadrax subassembly 900, e.g., by soldering wires 1155 into wire termination solder cups 265. For example, wires 1155 can be routed through one or more passages in rear insulator 1180, which includes a rear surface that abuts or is adjacent to the front surface of front bushing 1170. As shown in FIG. 11, rear insulator 1180 can include a central portion that extends forward between wire termination solder cups 265 of Quadrax subassembly 900.

Front bushing 1170 and rear insulator 1180 can both include an outer cylindrical surface that is configured to slide against and abut an inner surface of outer body 1030. The outer diameter of rear insulator 1180 can be smaller than the outer diameter of front bushing 1170 so that the front surface of front bushing 1170 can abut a step on the inner surface of outer body 1030, as shown in FIG. 11, to position front bushing 1070 in outer body 1030 and prevent front bushing 1070 from moving forward past the step.

Next, front insulator 1010 can be inserted into outer body 1030. Front insulator 1010 can include an outer surface that is configured to slide against and abut an inner surface of outer body 1030. Front insulator 1010 can also include passages through which contact pins 260 of Quadrax subassembly 900 can extend. Outer surface of front insulator 1010 can also include a step that engages a corresponding step in inner surface of outer body 1030, as shown in FIG. 11, to position front insulator 1010 in outer body 1030 and prevent front insulator 1010 from moving forward through front opening in outer body 1030.

Then, Quadrax subassembly 900, which is connected to the front end of Quadrax cable 1150 (around which rear insulator 1180, front bushing 1170, rear bushing 1175, and clamp nut 1190 are disposed), is inserted into outer body 1030 so that contact pins 260 of Quadrax subassembly 900 extend through the respective passages in front insulator 1010, as shown in FIG. 11. In this position, the front edges of PCBs 300 of Quadrax subassembly 900 abut or are adjacent to front insulator 1010. Alternatively, instead of separately inserting front insulator 1010 and Quadrax subassembly 900 into outer body 1030, front insulator 1010 can be inserted over contact pins 260 of Quadrax subassembly 900, and then front insulator 1010 and Quadrax subassembly 900 can be inserted together into outer body 1030.

When Quadrax subassembly 900 is disposed in outer body 1030, spring fingers 880 of ground clip 280 of Quadrax subassembly 900 can extend outward towards outer body 1030 to establish an electrical connection to outer body 1030. As a result, an unimpeded flow of ground currents is allowed to flow between ground planes 320 and ground plane contacts 350 of both PCBs 300 of Quadrax subassembly 900, ground clip 280 (including spring fingers 880), and outer body 1030.

Next, clamp nut 1190, which is slidably disposed around Quadrax cable 1150, can be inserted into the rear end of outer body 1030 around rear bushing 1175 to secure the various components inside outer body 1030. For example, the threaded outer surface of the front end of clamp nut 1190 can engage a threaded surface on an inner surface at the rear end of outer body 1030, as shown in FIG. 11. Clamp nut 1190 can be rotated or torqued down into outer body 1030 to secure clamp nut 1190 to outer body 1030. As a result, clamp nut 1190 can secure front insulator 1010, Quadrax subassembly 900, the front end of Quadrax cable 1150, front bushing 1170, and rear bushing 1175 inside outer body 1030. Alternatively, clamp nut 1190 can be secured to outer body 1030 using other types of connecting methods, such as friction fit, adhesive, crimping, etc.

Similar steps can be used in forming the Twinax pin contact with Twinax subassembly 200 as described above. For example, the Twinax cable can be prepared before being connected to Twinax subassembly 200 by disposing front bushing 1170, rear bushing 1175, rear insulator 1180, and/or clamp nut 1190 on end of Twinax cable, as described above in connection with Quadrax cable. Then, the Twinax cable can be connected to Twinax subassembly 200, e.g., by soldering the wires of the Twinax cable into wire termination solder cups 265. Next, front insulator 110 and Twinax subassembly 200 (around which rear insulator 1180, front bushing 1170, rear bushing 1175, and clamp nut 1190 are disposed) can be inserted into outer body 130 so that contact pins 260 of Twinax subassembly 200 extend through the respective passages in front insulator 110. Then, clamp nut 1190 can be inserted into the rear end of outer body 130 around rear bushing 1175 to secure the various components inside outer body 130.

In alternative embodiments, wire termination solder cups 265 can be omitted, and the pair(s) of wires of Twinax or Quadrax cable 1150 can be connected directly to solder pads 340 of PCB(s) 300. In other embodiments, wire termination solder cups 265 can be substituted by other types of connectors for removably or fixedly connecting the wires of Twinax or Quadrax cable 1150 to PCB(s) 300. Also, contact pins 260 can be substituted by other types of connectors, such as socket contacts, etc., for removably or fixedly connecting a device, other cable, etc., to PCB(s) 300. Twinax pin contact or Quadrax pin contact 1000 can be configured to receive signals from a signal source (not shown) either from Twinax or Quadrax cable 1150 connected at rear end, or from the device, other cable, etc., connected at the front end. As another alternative, instead of Twinax or Quadrax cables, other types of cables can be connected to the electrical connectors or pin contacts disclosed herein.

The operation of the disclosed electrical connectors, such as Twinax pin contact and Quadrax pin contact 1000 described above in connection with FIGS. 2-11, will now be explained.

Twinax pin contact, consistent with this disclosure, and Quadrax pin contact 1000, consistent with this disclosure, are configured to receive signals, such as high speed digital signals, from a source (not shown). The source can be capable of generating a spectrum of harmonic frequencies including at least one fundamental frequency and at least one higher-order odd harmonic frequency (e.g., the $3^{rd}$ harmonic, the $5^{th}$ harmonic, etc.). The source can be connected to Quadrax pin contact 1000 (or a Twinax pin contact) via Quadrax cable 1150 (or Twinax cabling), which is connected to cable socket 1020 of, for example, Quadrax pin contact 1000. In such an embodiment, the signals from Quadrax cable 1150 (or Twinax cabling) can be transmitted via wires 1155 of Quadrax cable 1150 (or the respective wires in Twinax cabling), connected to wire termination solder cups 265 (if provided), and the corresponding signal pads 340. The signals can be transmitted from signal pads 340 to equalizer chip 270, which processes the signals. Then, the signals can be transmitted via corresponding signal traces 310 to signal pads 340 proximal to the front end of Quadrax pin contact 1000 (or the respective Twinax pin contact) to which contact pins 260 are affixed. A device, other cable, etc., (not shown) including socket contacts can be connected to contact pins 260 to receive the processed signal from contact pins 260.

Alternatively, the signal source can be connected to Quadrax pin contact 1000 (or a Twinax pin contact) via contact pins 260, and the signals can be transmitted in the opposite direction than that described above. For example, the signals can be received by contact pins 260, transmitted to equalizer chip 270 that processes the signals, and then transmitted to Quadrax cable 1150 (or Twinax cabling, as the case may be) connected to cable socket 1020.

Equalizer chip 270 can include a processor configured to process the received signal. For example, the processor in equalizer chip 270 can serve as an equalizer that compensates for frequency dependant cable loss by acting as a high pass filter and/or by selectively attenuating the lower magnitude frequencies (e.g., at least one of the fundamental frequency, the $3^{rd}$ harmonic frequency, or the $5^{th}$ harmonic frequency), which can result in a more uniform attenuation across all frequency components, a resulting reduction in the distortion of the edges of the voltage pulse, and a consequent increase in the distance that high speed digital signals can be reliably transmitted. Alternatively or in addition, the processor can perform other functions on the received signal, such as other types of signal adjustment, analysis, etc., and is not limited to serving as an equalizer. For example, without limitation, the processor—in addition to providing for a more uniform attenuation across all frequency components—may also uniformly amplify all frequency components.

Accordingly, in one embodiment consistent with this disclosure, equalizer chip 270, configured as an in-line equalizer, is used to provide an electrical connector and/or cable assembly designed to fit within the size constraints of conventional Twinax or Quadrax pin contacts, and the resulting in-line equalizer can be a drop-in replacement for a non-equalized electrical connector or cable assembly, such as conventional non-equalized Twinax or Quadrax pin contacts. Including equalizer chip 270 can increase the data rates for a high speed digital signal and/or the distance over which the high speed digital signal can be transmitted over a length of copper or other electrically conductive cable. This can allow data transmission over distances that would otherwise not be reachable while maintaining signal integrity.

Electrical connectors consistent with the present disclosure, such as Twinax pin contact and Quadrax pin contact 1000 described above in connection with FIGS. 2-11, can be formed in various dimensions and sizes, such as, but not limited to, including size 8 or size 9 pin contacts of the type used, for example, in standards MIL-DTL-38999 (formerly MIL-C-38999) and/or SAE-AS39029 (formerly MIL-C-39029). Contact pins 260 can be sized to be disposed into a size 8 or size 9 socket contact (not shown). Twinax pin contact or Quadrax pin contact 1000 can be approximately 0.25 inches in diameter and approximately 1 inch long. As shown in FIG. 11, outer body 1030 of Twinax pin contact or Quadrax pin contact 1000 can have a diameter D that is less than approximately twice a diameter D2 of cable shield 1160 of Twinax or Quadrax cable 1150. For example, the diameter D of outer body 1030 can be approximately 0.25 inches, and the diameter D2 of cable shield 1160 of Twinax or Quadrax cable 1150 can be less than 0.25 inches, e.g., approximately 0.20-0.24 inches. The diameter D2 of cable shield 1160 can also be less than the diameter D of outer body 1030.

As shown in FIG. 3, PCB 300 can have a length L of approximately 0.300 inches, a width W of approximately 0.180 inches, and a thickness T of approximately 0.062 inches. In the embodiment shown in FIGS. 2-11, the length L of PCB 300 extends between the front end and the rear ends of PCB 300. The two PCBs 300 included in Quadrax pin contact 1000 can be identical except for the location of PCB slot 370 in the front or rear end. PCB slot 370 in each PCB 300 can have a width that is approximately equal to the thickness T of PCB 300 configured to be inserted into PCB slot 370. PCB slot 370 in each PCB 300 can have a length that is at least approximately equal to one-half of the length L of PCB 300 on which the PCB slot is exhibited, or of another PCB 300 configured to be inserted along the lengthwise (longitudinal) direction of PCB slot 370. For example, PCB slot 370 can have a width of approximately 0.062 inches and a length of approximately 0.150 inches.

Also, the size of PCB 300 can be relatively small compared to Twinax or Quadrax cable 1150. For example, the width W of PCB 300 can be less than approximately twice the diameter D2 of cable shield 1160 or can be approximately less than the diameter D2 of cable shield 1160. The numeric and relative dimensions described herein are exemplary and are not intended to be limiting.

Because Twinax pin contact and Quadrax pin contact 1000 are assembled using similar or the same components (e.g., ground clip 280, rear-slot PCB and chip assembly 400, and/or front-slot PCB and chip assembly 500), both types of pin contacts can be assembled using fewer different types of components, thereby decreasing the costs of assembling both types of pin contacts.

The disclosed electrical connectors can accommodate either a Twinax or Quadrax configuration, and can serve as in-line equalizers designed to fit within a size 8 or size 9 Twinax or Quadrax pin contacts or other electrical connectors that are swappable with conventional non-equalized size 8 or size 9 Twinax or Quadrax pin contacts or other electrical connectors that are small, popular, and/or used for aerospace, defense, and commercial (e.g., commercial aviation) applications.

It will be apparent to those skilled in the art that various modifications and variations can be made in the disclosed systems and processes without departing from the scope of the disclosure. That is, other embodiments will be apparent to those skilled in the art from consideration of the specification and practice of the disclosure. It is intended that the specification and examples be considered as exemplary only, with a true scope being indicated by the following claims and their equivalents.

What is claimed is:

1. An electrical connector comprising:
    a printed circuit board configured to exhibit a first length L, a first width W, and a thickness T;
    where the printed circuit board is configured to exhibit a printed circuit board slot of a slot-width approximately equal to the thickness T, and the printed circuit board slot also exhibits a slot-length at least approximately equal to one-half of the first length L;
    the printed circuit board including at least a first signal trace, a second signal trace, and a ground plane, where the printed circuit board is configured to electrically isolate the first signal trace and the second signal trace from the ground plane;
    the first signal trace is configured to make electrical contact with at least a first electrically conductive cable; and
    at least a first contact pin affixed to the printed circuit board and configured to make electrical contact with the second signal trace.

2. The electrical connector of claim 1:
wherein at least one of the set of the first electrically conductive cable and the first contact pin are configured to transmit a plurality of signals from a source of high speed digital signals, the source of high speed digital signals configured to generate a spectrum of harmonic frequencies comprising at least one fundamental frequency and one higher-order odd harmonic frequency.

3. The electrical connector of claim 2, further comprising:
a processor affixed to the printed circuit board and configured to process at least one frequency selected from the set of: the fundamental frequency and the higher-order odd harmonic frequency.

4. The electrical connector of claim 3, wherein the processor comprises a high-pass filter.

5. The electrical connector of claim 3, wherein the processor is configured to selectively attenuate the fundamental frequency.

6. The electrical connector of claim 1, further including a ground clip electrically connected to the ground plane, the printed circuit board at least partially disposed within the ground clip.

7. The electrical connector of claim 6, further including an outer body, wherein the printed circuit board, the contact pin, and the ground clip are at least partially disposed within the outer body.

8. The electrical connector of claim 3, wherein the printed circuit board exhibits a cavity in the ground plane, and wherein the processor is at least partially disposed within the cavity.

9. The electrical connector of claim 1, further comprising:
at least a first socket affixed to the printed circuit board and configured to make electrical contact with the first signal trace; and
at least a first signal pad,
wherein the first socket is electrically connected to the first signal pad and is configured to make electrical contact with the first electrically conductive cable.

10. The electrical connector of claim 9, further comprising at least a second signal pad, wherein the first contact pin is electrically connected to the second signal pad.

11. The electrical connector of claim 10:
wherein at least one of the set of the first electrically conductive cable and the first contact pin are configured to transmit a plurality of signals from a source of high speed digital signals, the source of high speed digital signals configured to generate a spectrum of harmonic frequencies comprising at least one fundamental frequency and one higher-order odd harmonic frequency.

12. The electrical connector of claim 11, further comprising:
a processor affixed to the printed circuit board and configured to process at least one frequency selected from the set of: the fundamental frequency and the higher-order odd harmonic frequency.

13. The electrical connector of claim 1, further comprising:
a second printed circuit board configured to exhibit a second width W2 approximately equal to the first width W;
the second printed circuit board also configured to exhibit a second thickness T2 and a second printed circuit board slot of a second slot-width, where both the second thickness T2 and the second slot-width are approximately equal to the thickness T;
a ground clip electrically connected to the ground plane;
wherein the printed circuit board and the second printed circuit board are both configured to be at least partially disposed within the ground clip.

14. The electrical connector of claim 13, wherein the printed circuit board is at least partially disposed within in the second printed circuit board slot, and the second printed board is at least partially disposed in the printed circuit board slot.

15. The electrical connector of claim 1, wherein the printed circuit board further includes a second ground plane, where the printed circuit board is configured to electrically isolate the first signal trace and the second signal trace from the second ground plane.

16. An electrical connector comprising:
a printed circuit board configured to exhibit a first width W;
the printed circuit board including at least a first signal trace, a second signal trace, and a ground plane, where the printed circuit board is configured to electrically isolate the first signal trace and the second signal trace from the ground plane;
the first signal trace is configured to make electrical contact with at least a first electrically conductive cable;
at least a first contact pin affixed to the printed circuit board and configured to make electrical contact with the second signal trace;
wherein the first electrically conductive cable is electrically isolated from and disposed within electrically conductive shielding such that the electrically conductive shielding forms a contiguous cylinder of approximate diameter D; and
where the first width W is less than approximately twice the diameter D.

17. The electrical connector of claim 16:
wherein at least one of the set of the first electrically conductive cable and the first contact pin are configured to transmit a plurality of signals from a source of high speed digital signals, the source of high speed digital signals generating a spectrum of harmonic frequencies comprising at least one fundamental frequency and one higher-order odd harmonic frequency.

18. The electrical connector of claim 17, further comprising:
a processor affixed to the printed circuit board and configured to process at least one frequency selected from the set of: the fundamental frequency and the higher-order odd harmonic frequency.

19. The electrical connector of claim 18, wherein the processor comprises a high-pass filter.

20. The electrical connector of claim 18, wherein the processor is configured to selectively attenuate the fundamental frequency.

21. The electrical connector of claim 16, further including a ground clip electrically connected to the ground plane, the printed circuit board being at least partially disposed within the ground clip.

22. The electrical connector of claim 21, further including an outer body, wherein the printed circuit board, the contact pin, and the ground clip are at least partially disposed within the outer body.

23. The electrical connector of claim 18, wherein the printed circuit board exhibits a cavity in the ground plane, and wherein the processor is at least partially disposed within the cavity.

24. The electrical connector of claim 16, further comprising:
at least a first socket affixed to the printed circuit board and coupled to the first signal trace; and
at least a first signal pad, wherein the first socket is electrically connected to the first signal pad and is configured to make electrical contact with the first electrically conductive cable.

25. The electrical connector of claim 24, further comprising at least a second signal pad, wherein the first contact pin is electrically connected to the second signal pad.

26. The electrical connector of claim 25:
wherein at least one of the set of the first electrically conductive cable and the first contact pin are configured to transmit a plurality of signals from a source of high speed digital signals, the source of high speed digital signals configured to generate a spectrum of harmonic frequencies comprising at least one fundamental frequency and one higher-order odd harmonic frequency.

27. The electrical connector of claim 26, further comprising:
a processor affixed to the printed circuit board and configured to process at least one frequency selected from the set of: the fundamental frequency and the higher-order odd harmonic frequency.

28. The electrical connector of claim 16, further comprising:
a second printed circuit board configured to exhibit a second width W2 approximately equal to the first width W;
a ground clip electrically connected to the ground plane;
wherein the printed circuit board and the second printed circuit board are both configured to be at least partially disposed within the ground clip.

29. The electrical connector of claim 28, wherein the second printed circuit board exhibits a second printed circuit board slot and the printed circuit board is at least partially disposed within the second circuit board slot.

30. The electrical connector of claim 16, wherein the printed circuit board further includes a second ground plane, where the printed circuit board is configured to electrically isolate the first signal trace and the second signal trace from the second ground plane.

31. An electrical connector comprising:
a first printed circuit board including a first printed circuit board slot;
a second printed circuit board at least partially disposed within the first printed circuit board slot;
wherein the first printed circuit board includes at least a first signal trace, a second signal trace, and a first ground plane, and where the first printed circuit board is configured to electrically isolate the first signal trace and the second signal trace from the first ground plane;
wherein the second printed circuit board includes at least a third signal trace, a fourth signal trace, and a second ground plane, and where the second printed circuit board is configured to electrically isolate the third signal trace and the fourth signal trace from the second ground plane;
at least a first contact pin affixed to the first printed circuit board and configured to make electrical contact with the second signal trace, and a second contact pin affixed to the second printed circuit board and configured to make electrical contact with he fourth signal trace; and
at least one processor affixed to one of the set of: the first printed circuit board and the second printed circuit board.

32. The electrical connector of claim 31, wherein the second printed circuit board exhibits a second printed circuit board slot; and the first printed circuit board is inserted into the second printed circuit board slot.

33. The electrical connector of claim 32, wherein the second printed circuit board is disposed at an angle with respect to the first printed circuit board.

34. The electrical connector of claim 33, wherein the angle is approximately 90 degrees.

35. The electrical connector of claim 31, further including an outer body, wherein the first printed circuit board, the second printed circuit board, the at least one processor, the first contact pin, and the second contact pin are at least partially disposed in the outer body.

36. A method of forming an electrical connector, the method comprising:
affixing a processor to a printed circuit board;
attaching a contact pin to the printed circuit board; and
disposing at least a portion of the processor, the contact pin, and the printed circuit board into an outer body;
where the printed circuit board includes at least a first signal trace, a second signal trace, and a ground plane, and where the printed circuit board is configured to electrically isolate the first signal trace and the second signal trace from the ground plane;
where the processor is electrically connected to the first signal trace and the second signal trace; and
where the printed circuit board is further configured to exhibit a first length L, a thickness T, and a printed circuit board slot of a slot-width approximately equal to the thickness T, and the printed circuit board slot also exhibits a slot-length at least approximately equal to one-half of the first length L.

37. The method of claim 36, wherein affixing the processor to the printed circuit board includes at least partially disposing the processor in a cavity in the ground plane.

38. The method of claim 36, further comprising:
disposing at least a portion of a second printed circuit board into the printed circuit board slot.

39. The method of claim 36, further comprising:
disposing at least a portion of the processor and the printed circuit board into a ground clip; and
electrically connecting the ground plane to the ground clip;
wherein the ground clip is at least partially disposed within the outer body.

40. The method of claim 36, further comprising:
connecting an electrically conductive cable to the first signal trace sufficient to establish an electrical connection between the electrically conductive cable and the first signal trace;
wherein the second signal trace is configured to make electrical contact with the contact pin.

41. The method of claim 40:
wherein at least one of the set of the electrically conductive cable and the contact pin are configured to transmit a plurality of signals from a source of high speed digital signals, the source of high speed digital signals configured to generate a spectrum of harmonic frequencies comprising at least one fundamental frequency and one higher-order odd harmonic frequency.

42. The method of claim 41:
wherein the processor is configured to process at least one frequency selected from the set of: the fundamental frequency and the higher-order odd harmonic frequency.

43. The method of claim 42:
wherein the processor comprises a high-pass filter.

44. The method of claim 42:
wherein the processor is configured to selectively attenuate the fundamental frequency.

45. A method of forming an electrical connector, the method comprising:

affixing a processor to a printed circuit board;
attaching a contact pin to the printed circuit board;
disposing at least a portion of the processor, the contact pin, and the printed circuit board into an outer body of approximate diameter D; and
affixing the outer body to a communications cable;
where the printed circuit board includes at least a first signal trace, a second signal trace, and a ground plane, and where the printed circuit board is configured to electrically isolate the first signal trace and the second signal trace from the ground plane;
where the processor is electrically connected to the first signal trace and the second signal trace; and
where the communications cable comprises an electrically conductive cable disposed within electrically conductive shielding such that the electrically conductive shielding forms a contiguous cylinder of approximate diameter D2; and
where the diameter D is less than approximately twice the diameter D2.

46. The method of claim 45, wherein affixing the processor to the printed circuit board includes at least partially disposing the processor in a cavity in the ground plane.

47. The method of claim 45, where the printed circuit board is further configured to exhibit a printed circuit board slot, the method further comprising:
disposing at least a portion of a second printed circuit board into the printed circuit board slot.

48. The method of claim 45, further comprising:
disposing at least a portion of the processor and the printed circuit board into a ground clip; and
electrically connecting the ground plane to the ground clip;
wherein the ground clip is at least partially disposed within the outer body.

49. The method of claim 45, further comprising:
connecting the electrically conductive cable to the first signal trace sufficient to establish an electrical connection between the electrically conductive cable and the first signal trace;
wherein the second signal trace is configured to make electrical contact with the contact pin.

50. The method of claim 49:
wherein at least one of the set of the electrically conductive cable and the contact pin are configured to transmit a plurality of signals from a source of high speed digital signals, the source of high speed digital signals configured to generate a spectrum of harmonic frequencies comprising at least one fundamental frequency and one higher-order odd harmonic frequency.

51. The method of claim 50:
wherein the processor is configured to process at least one frequency selected from the set of: the fundamental frequency and the higher-order odd harmonic frequency.

52. The method of claim 51:
wherein the processor comprises a high-pass filter.

53. The method of claim 51:
wherein the processor is configured to selectively attenuate the fundamental frequency.

* * * * *